United States Patent [19]

Moran

[11] Patent Number: 4,606,788

[45] Date of Patent: Aug. 19, 1986

[54] METHODS OF AND APPARATUS FOR FORMING CONDUCTIVE PATTERNS ON A SUBSTRATE

[76] Inventor: Peter L. Moran, 3 Falcon Hill, Lover's Walk, Montenotte, Cork, Ireland

[21] Appl. No.: 719,375

[22] Filed: Apr. 3, 1985

[30] Foreign Application Priority Data

Apr. 12, 1984 [GB] United Kingdom ................ 8409504

[51] Int. Cl.$^4$ .......................... C23F 1/02; B44C 1/22; C03C 15/00; C03C 25/06
[52] U.S. Cl. ..................... 156/656; 29/846; 156/659.1; 156/664; 156/901; 156/345; 156/635; 174/68.5; 427/96; 428/601; 428/615; 428/901; 430/313; 430/315; 430/318
[58] Field of Search .................. 156/635, 656, 659.1, 156/664, 901, 902, 345; 174/68.5; 29/846, 847, 855; 427/96, 98; 204/15; 428/601, 615, 189, 901; 430/313, 315, 318

[56] References Cited

U.S. PATENT DOCUMENTS

| | | | |
|---|---|---|---|
| 3,615,465 | 10/1971 | Bullinger | 156/635 |
| 3,837,944 | 9/1974 | Cole | 156/635 |
| 3,881,884 | 5/1975 | Cook et al. | 156/657 X |
| 3,883,947 | 5/1975 | Kruger et al. | 156/656 X |
| 4,357,202 | 11/1982 | Rutz | 156/667 X |

*Primary Examiner*—William A. Powell
*Attorney, Agent, or Firm*—Christie, Parker & Hale

[57] ABSTRACT

A method of forming an electrically conductive pattern on a substrate includes the steps of forming a layer of gold on an electrically insulating substrate and coating the gold layer with a photo-resist. The resist is exposed to light through a photo mask and the exposed portions of the photo-resist are selectively removed by etching. The now exposed parts of the gold layer are coated with copper and the remaining photo-resist is removed. The exposed parts of the gold layer and the copper are subjected to molten tin which simultaneously acts to dissolve the exposed parts of the gold layer and to form an electrically conductive coating on the copper.

The process enables the formation of a precise conductive pattern with enhanced reliability.

20 Claims, 11 Drawing Figures

METHODS OF AND APPARATUS FOR FORMING CONDUCTIVE PATTERNS ON A SUBSTRATE

BACKGROUND OF THE INVENTION

1. Field of the Invention

The present invention relates to methods of and apparatus for forming conductive patterns on a substrate.

2. Description of the Prior Art

It has been proposed to produce conductive strips on a substrate to form connections between integrated circuits. Such conductive strips are of low cost metals such as copper and tin and are formed on a ceramic substrate or a multi-layered substrate including glass or glass-ceramic materials. One process for forming such conductors is to etch a solid film of conductor formed on a substrate. With such etching techniques, however, the etching fluid tends to undercut the conductors and so there is a limit to the width to which such conductors can in practice be formed. Also etching techniques are wasteful of materials and disposal of the waste products can be difficult.

Another method of forming conductors is to screen print the conductors on the substrate. In practice, however, the resolution of screen printing is limited and so again this places a limit on the width of and spacing between the conductors which can be formed on a substrate.

A still further method of forming conductors on a substrate is by means of an additive method using a plating or lift-off evaporation process. Again in practice such techniques either require the extensive use of aqueous processes, which is undesirable, or require high cost equipment to achieve high accuracy.

It is an object of the invention to provide a high resolution method of forming a conductive pattern on a substrate.

SUMMARY OF THE INVENTION

According to the present invention, there is provided a method of forming a conductive pattern on a substrate comprising the steps of coating the substrate with a first electrically conductive material to form a first layer, forming a resist pattern on the first layer, depositing a second electrically conductive material on the parts of the first layer not covered by the resist pattern, removing the resist pattern and temporarily subjecting the now exposed parts of the first layer and the deposits of said second conductive material, with a third electrically conductive material in its molten state, the third electrically conductive material being such that when in its molten state it act simultaneously to dissolve the first conductive material and to provide a coating on said second electrically conductive material.

According to the present invention, there is further provided a method of forming an electrically conductive pattern on a substrate comprising the steps of forming a layer of gold on an electrically insulating substrate, coating said gold layer with a photo-resist, exposing the photo-resist to light through a photo mask, selectively removing the exposed portions of the photo-resist, coating the now exposed parts of the gold layer with a second electrically conductive material other than gold, removing the remaining photo-resist and subjecting the exposed parts of the gold layer and the said second electrically conductive material to a third electrically conductive material in molten form, the third electrically conductive material being such that it simultaneously acts to dissolve the exposed parts of the gold layer and form an electrically conductive coating on the second electrically conductive material.

According to the present invention, there is still further provided apparatus for treating a substrate carrying an electrically conductive pattern comprising a container for containing an oxidation inhibiting vapourisable liquid, heating means for heating the container to a level at which the liquid therein vapourises, a vessel for holding a molten electrically conductive material, means supporting the vessel in the container to be above the liquid phase of the vapourisable liquid and means for displacing said substrate along a predetermined path through the container to the vessel, whereby when the heater is operative it will cause the vapourisable liquid to vapourise and the vapour to heat the material in the vessel to its molten state, and to form a preheating oxidation inhibiting environment around the said path.

BRIEF DESCRIPTION OF THE DRAWINGS

Methods of forming conductive patterns on a substrate and embodying the invention will now be described by way of example, with reference to the accompanying diagrammatic drawings, in which.

DESCRIPTION OF THE PREFERRED EMBODIMENT

Figure 1:
FIGS. 1 to 5 are fragmentary sections through a substrate at different stages of the process.

As shown in FIG. 1, an inorganic substrate 2 of a ceramic, glass, glass-ceramic material is coated with 0.2 micron thick layer 6 of gold. This gold layer 6 is formed by screen printing a mixture of a gold metallorganic material (an organic material having gold radicals) and a base metal metall-organic material (which forms a metal oxide on heating) to coat the whole surface of this substrate. The assembly is then fired in an oven to release the organic materials and leave the gold deposited as a layer 6 on the substrate. The adherence of the gold layer 6 to the substrate is effected by the aforesaid metal oxide.

A photo-resist is then deposited as a layer to cover the gold layer 6. The photo-resist layer can be formed by laminating a dry film resist on to the layer 6 or coating the layer 6 with a wet film resist and then drying. The photo-resist layer is then selectively exposed to light through a photo mask (not shown) defining a desired pattern and etched to leave the pattern 8 (see FIG. 2).

In this particular instance, the pattern is in the form of a plurality of parallel strips 10.

Figure 3:
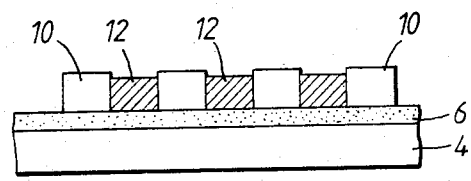

The assembly is then plated with copper. Since the resist strips 10 are electrically insulating and the exposed gold layer 6 is electrically conductive, electroplating or electroless plating with copper will only deposit a copper layer on the exposed parts of the gold layer. Accordingly, a series of copper strips 12 are formed between the strips 10 of the etched resist layer 8 (see FIG. 3).

Figure 4:
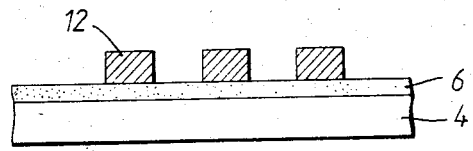
Figure 5:
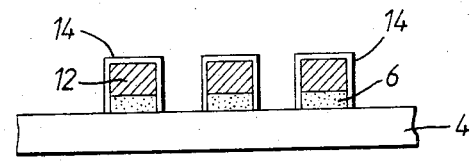

A solvent is used to remove the strips 10 of the resist material so as to leave (as shown in FIG. 4) a gold layer 6 carrying a conductive pattern of copper.

The assembly is then dipped for a period of a few seconds in molten tin which will dissolve the exposed parts of the gold layer and simultaneously coat the strips 12 of copper with a layer of tin 14.

The resultant board with its tin plated copper conductors or tracks is ready for soldering to integrated circuits and the like.

Figure 6:
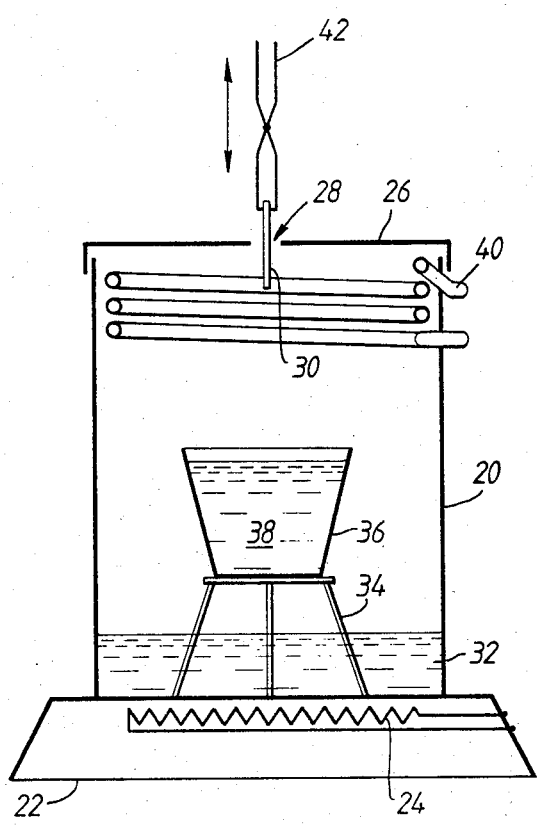
FIG. 6 is a front elevation of the apparatus for performing the last stage of the process illustrated in FIG. 5.

FIG. 6 shows the apparatus used for simultaneously dissolving the exposed parts of the gold layer and coating the copper conductors or tracks with tin.

As shown, a stainless steel container 20 is supported on a heater 22 incorporating a heating element 24. The container 20 is covered by lid 26 having a slotted opening 28 through which an assembly 30 can be introduced in the container and then subsequently witdrawn.

The container 20 is partly filled with a fluorinated hydrocarbon 32, such as for example Fluorinert FC 71 manufactured by 3M's. This hydrocarbon has a boiling point of approximately 250° C.

A stand 34 supports a ceramic vessel containing pure tin 38, above the level of the liquid hydrocarbon 32. A cooling coil 40 is located in the upper region of the container 20.

In operation, the heating coil 24 of the heater is energised to heat the container to a temperature of at least 250° C. At this temperature the fluorinated hydrocarbon boils to fill the volume of the container above the level of the liquid with hot vapour. This hot vapour heats the vessel 36 and the tin therein (which has a melting point of about 230° C.), to cause the tin to melt and so provide a bath of molten tin. Any vapour reaching the upper extremity of the container is condensed by the cooling coil 40 and returned to the liquid at the bottom of the container.

At this point, the assembly 28, held by a pair of tongs 42 or other support members, is lowered through the opening 28. As it passes into the container 20, it is initially heated by the vapourised hydrocarbon which also acts to inhibit oxidation. Eventually the assembly 30 is immersed in the molten tin for a period sufficient to dissolve the gold and coat the copper conductors with tin. The board is then withdrawn from the bath of molten tin and up through the opening in the lid 26 of the container and left to cool.

Because the assembly passes through the hot vapour phase of the hydrocarbon, both before and after being immersed in the molten tin, the preheating and precooling action effected by the vapour is conductive to the formation of a thin layer of tin, thereby reducing the risk of the tin bridging the conductors, and reduces the risk of thermal shock to the assembly and therefore damage to the conductors.

It will be appreciated that instead of pure tin, a tin based compound can be used, for example a tin/lead or tin/silver alloy, tin/lead/silver alloy. The alloys can also include the elements of Bismuth, Antimony or Indium.

In a modification a fluid such as Arklone P (Registered Trade Mark of ICI) or Freon TF (Registered Trade Mark of DuPont) is added to the fluorinated hydrocarbon so that when heated a vapour layer of this material floats on top of the vapourised fluorinated hydrocarbon. This acts to reduce the loss of the fluorinated hydrocarbon from the system.

It has been found that with the above described method to produce a series of parallel conductors providing connections between integrated circuits, a particularly high density of conductors has been achieved. Specifically, conductors 20 micrometers thick, 30 micrometers wide, having a spacing of 30 micrometers between conductors, has been consistently achieved with a particularly low failure rate. Narrower conductors and narrower spacings can be achieved with the above described method.

It will be appreciated that the use of metallorganic materials to produce a gold layer eliminates the need for either aqueous processing or expensive thin film processing to produce a seed layer. The oxide-glass forming adhesive mechanism between the gold and multilayer, gives a high adhesion, even to glass surfaces. The use of molten tin to dissolve the exposed gold portions eliminates the need for removing a seed layer with ionic aqueous fluids. The use of such fluids generally introduces a reliability hazard.

The tinned copper conductors produced by the described method, avoid the need for subsequent preparatory operations such as would be needed when reflowing chip carriers and performing similar operations.

It will be appreciated that instead of gold, silver can be used to provide the layer 6. The gold or silver may be alloyed with up to 25% platinum or other material to reduce metal migration or the solubility in the tin.

Figure 2:
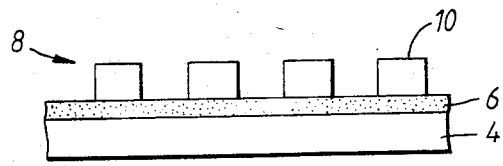

In a modification, following the plating step shown in FIG. 2 in which conductors 12 are formed by plating between the strips of resist 10, a further layer of resist is deposited to cover the existing resist strips 10 and the conductors and further selective etching takes place to expose selected ones of the conductors 12 and to keep others covered. A second plating operation is effected and the resist is then removed as shown in FIG. 4. The result is that some conductors 12 (which can be used to carry power current) will be thicker than other conductors 12 (which can be used to carry signals). The definition of conductors achieved with this arrangement is high.

In yet another modification where a multilayer structure is required the processes may be used to form the top conductive layer of the structure. This is more clearly shown in FIGS. 7 to 11.

Figure 7:
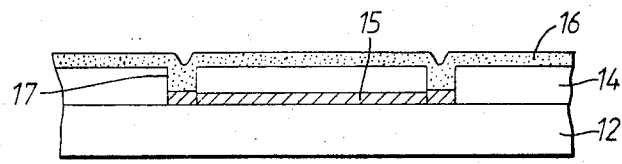
FIGS. 7 to 11 are fragmentary sections through a multilayer system at different stages of the process.
Figure 8:
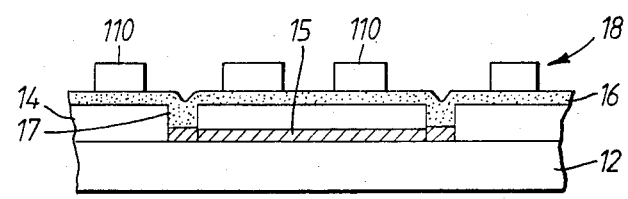
Figure 9:
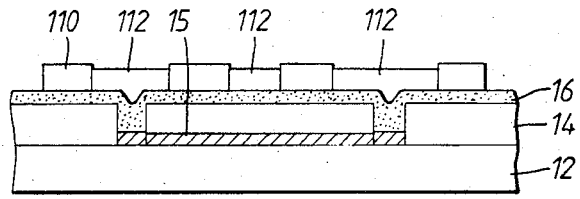
Figure 10:
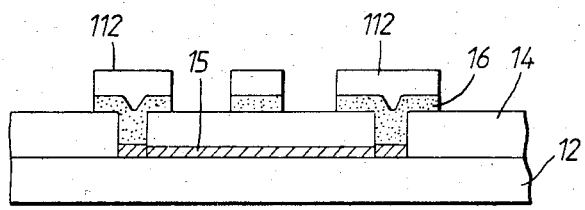

As shown in FIG. 7, an inorganic substrate 12 of a ceramic, glass, glass-ceramic material supports a multilayer structure. The structure includes a conductive pattern 15 (which may have been formed by thick film plating or cofired ceramic methods for example). The conductive pattern 15 is coated with an insulated layer 14 which is then fired. Through holes 17 are provided in the insulating layer 14 to expose the underlying conductor. The strucutre is coated with a 0.2 micron thick layer 16 of gold. This gold layer 16 is formed by screen printing a mixture of a gold metallorganic material (an organic material having gold radicals) and a base metal metall-organic material (which forms a metal oxide on heating) to coat the whole surface of the layer 14 and the through holes 17. The assembly is then fired in an over to release the organic materials and leave the gold deposited as a layer 16 on the layer 14 of multilayer structure. The adherence of the gold layer 16 to the layer 14 is effected by the aforesaid metal oxide.

A photo-resist is then deposited as a layer to cover the gold layer 16. The photo-resist layer can be formed by laminating a dry film resist on to the layer 16 or coating the layer 16 with a wet film resist and then drying. The photo-resist layer is then selectively exposed to light through a photo mask (not shown) defining a desired pattern and etched to leave the pattern 18 (see FIG. 8).

In this particular instance, the pattern is in the form of a plurality of parallel strips 110.

The assembly is then plated with copper. Since the resist strips 110 are electrically insulating and the exposed gold layer 16 is electrically conductive, electroplating or electroless plating with copper will only deposit a copper layer on the exposed parts of the gold layer. Accordingly, a series of copper strips 112 are formed between the strips 110 of the etched resist layer 18 (see FIG. 9).

Figure 11:
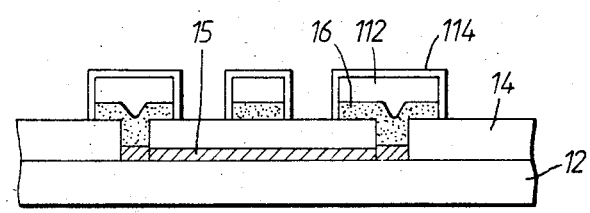

A solvent is used to remove the strips 110 of the resist material so as to leave (as shown in FIG. 11) a gold layer 16 carrying a conductive pattern of copper.

The assembly is then dipped in molten tin which will dissolve the exposed parts of the gold layer and simultaneously coat the strips 112 of copper with a layer of tin 114.

The resultant multilayer board with its tin plated copper conductors or tracks on the top surface is ready for soldering to integrated circuits and the like.

What is claimed is:

1. A method of forming a conductive pattern on a substrate comprising:
   the steps of coating the substrate with a first electrically conductive material, to form a first layer;
   forming a resist pattern on the first layer;
   depositing a second electrically conductive material on the parts of the first layer not covered by the resist pattern;
   removing the resist pattern, and
   temporarily subjecting the now exposed parts of the first layer and the deposits of said second conductive material with a third electrically conductive material in its molten state, the third electrically conductive material being such that when in its molten state it acts simultaneously to dissolve the first conductive material and to provide a coating on said second electrically conductive material.

2. A method according to claim 1, wherein said first electrically conductive layer comprises gold or an alloy thereof.

3. A method according to claim 1, wherein said first electrically conductive layer comprises silver or an alloy thereof.

4. A method according to claim 1, wherein said second electrically conductive material comprises copper.

5. A method according to claim 1, wherein said third electrically conductive material is selected from the group consisting of tin, an alloy of tin and silver, an alloy of tin and lead, and an alloy of lead silver and tin.

6. A method according to claim 1 including the steps of:
   increasing the thickness of selected parts of the deposited second electrically conductive material by forming a further resist pattern following the deposit of the second electrically conductive material, but prior to the removal of the resist pattern, and
   subjecting the parts of the second electrically conductive material not covered by the further resist pattern, to a further deposit of said second electrically conductive material.

7. A method of forming an electrically conductive pattern on a substrate comprising the steps of:
   forming a layer of gold or silver on an electrically insulating substrate;
   coating said gold or silver layer with a photo-resist;
   exposing the photo-resist to light through a photo mask;
   selectively removing the exposed portions of the photo-resist;
   coating the now exposed parts of the gold or silver layer with a second electrically conductive material other than gold or silver;
   removing the remaining photo-resist, and
   subjecting the exposed parts of the gold or silver layer and the said second electrically conductive material to a third electrically conductive material in molten form, the third electrically conductive material being such that it simultaneously acts to dissolve the exposed parts of the gold or silver layer and form an electrically conductive coating on the second electrically conductive material.

8. A method according to claim 7, wherein the step of coating the exposed parts of the gold or silver layer with said second electrically conductive material is performed by an electro-plating method.

9. A method according to claim 7, wherein the step of coating the exposed parts of the gold or silver layer with said second electrically conductive material is performed by an electroless plating method.

10. A method according to claim 7, wherein the step of forming a layer of gold or silver comprises the steps of:
    screen printing a mixture of a gold or silver metallorganic and a metal oxide forming material on said substrate and then
    heating to fire said mixture, whereby the metal oxide formed upon firing adheres said gold or silver layer to said substrate.

11. A method according to claim 10, wherein said step of forming the gold or silver layer comprises forming a gold or silver layer less than 0.5 micron thick.

12. A method according to claim 7, wherein the step of subjecting the exposed parts of the gold or silver layer and the second electrically conductive material to said third electrically conductive material comprises the steps of:
    pre-heating the substrate and all that it carries, in an atmosphere which inhibits oxidation;
    immersing the substrate in a molten bath of said third electrically conductive material, and
    withdrawing the substrate back through said atmosphere.

13. A method according to claim 12, wherein said atmosphere is used to heat said third electrically conductive material to its molten state.

14. A method according to claim 7, wherein said third electrically conductive material is selected from the group consisting of tin, a tin/lead alloy, a tin/silver alloy and a tin/lead/silver alloy.

15. Apparatus for treating a substrate carrying an electrically conductive pattern comprising:
    a container for containing an oxidation inhibiting vapourisable liquid;
    heating means for heating the container to a level at which the liquid therein vapourises;
    a vessel for holding a molten electrically conductive material;
    means supporting the vessel in the container to be above the liquid phase of the vapourisable liquid, and
    means for displacing said substrate along a predetermined path through the container to the vessel, whereby when the heater is operative it will cause the vapourisable liquid to vapourise and the vapour to heat the material in the vessel to its molten state, and to form a preheating oxidation inhibiting environment around the said path.

16. A circuit comprising an electrically insulating substrate and an electrically conductive pattern carried by the substrate characterized in that the pattern comprises:
   a first electrically conductive material forming a first layer on the substrate,
   a second electrically conductive material forming a second layer on the first layer, and
   a coating of a third electrically conductive material on the second layer; the third electrically conductive material, when in its molten state, being capable of coating the second material and dissolving the first material.

17. A circuit according to claim 16 wherein said first electrically conductive material is selected from the group consisting of gold, gold alloy, silver and silver alloy.

18. A circuit according to claim 17 wherein said second electrically conductive material comprises copper.

19. A circuit according to claim 16 wherein said second electrically conductive material comprises copper.

20. A circuit according to claim 16 wherein said third electrically conductive material is selected from the group consisting of tin, an alloy of tin and silver, an alloy of tin and lead, and an alloy of lead, silver and tin.

* * * * *